(12) United States Patent
Kuroki

(10) Patent No.: US 11,808,827 B2
(45) Date of Patent: Nov. 7, 2023

(54) MAGNETIC SENSOR

(71) Applicant: TDK Corporation, Tokyo (JP)

(72) Inventor: Koji Kuroki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/760,946

(22) PCT Filed: Aug. 4, 2020

(86) PCT No.: PCT/JP2020/029808
§ 371 (c)(1),
(2) Date: Mar. 16, 2022

(87) PCT Pub. No.: WO2021/059751
PCT Pub. Date: Apr. 1, 2021

(65) Prior Publication Data
US 2022/0342011 A1  Oct. 27, 2022

(30) Foreign Application Priority Data

Sep. 26, 2019  (JP) ................................. 2019-175986

(51) Int. Cl.
*G01R 33/09* (2006.01)
(52) U.S. Cl.
CPC .................................... *G01R 33/09* (2013.01)
(58) Field of Classification Search
CPC ....................................................... G01R 33/09
See application file for complete search history.

(56) References Cited

U.S. PATENT DOCUMENTS 4,663,684 A * 5/1987 Kamo .................. G11B 5/3903
360/327.2
5,402,292 A   3/1995 Komoda et al.
(Continued)

FOREIGN PATENT DOCUMENTS

EP     3 467 529 B1    12/2021
EP     3 467 530 B1     8/2022
(Continued)

OTHER PUBLICATIONS

International Search Report issued in corresponding International Patent Application No. PCT/JP2020/029808, dated Oct. 27, 2020, with English translation.

(Continued)

*Primary Examiner* — Alesa Allgood
(74) *Attorney, Agent, or Firm* — McDermott Will & Emery LLP

(57) ABSTRACT

A magnetic sensor has a magnetoresistive strip including a plurality of magnetoresistive elements arranged in the y-direction through a plurality of hard magnetic members and ferromagnetic films arranged in the x-direction through a magnetic gap. The magnetoresistive strip is disposed around a magnetic gap. One end of the magnetoresistive strip in the y-direction is connected to a terminal electrode not through another magnetoresistive element applied with another magnetic field to be detected, and the other end thereof in the y-direction is connected to a terminal electrode not through another magnetoresistive element applied with the magnetic field to be detected. The magnetoresistive strip S thus has a linear shape not having a folded structure, so that the relation between the direction of a magnetic bias and the direction of flow of current becomes constant over all the sections of the magnetoresistive strip.

8 Claims, 8 Drawing Sheets

(56) References Cited

U.S. PATENT DOCUMENTS

| | | | |
|---|---|---|---|
| 5,737,156 A | 4/1998 | Bonyhard | |
| 2006/0209470 A1* | 9/2006 | Ohta | G11B 5/3932 |
| 2010/0253330 A1 | 10/2010 | Sasaki et al. | |
| 2015/0333133 A1 | 11/2015 | Boettcher et al. | |
| 2016/0254357 A1 | 9/2016 | Aketa | |
| 2019/0148563 A1 | 5/2019 | Sasaki et al. | |

FOREIGN PATENT DOCUMENTS

| | | |
|---|---|---|
| JP | 62-137713 A | 6/1987 |
| JP | 2012-122792 A | 6/2012 |
| JP | 5066579 B2 | 11/2012 |
| JP | 2017-199869 A | 11/2017 |
| WO | 2015/060441 A1 | 4/2015 |
| WO | 2016/075927 A1 | 5/2016 |

OTHER PUBLICATIONS

Extended European Search Report issued in corresponding European Patent Application No. 20868481.1-1212, dated Sep. 20, 2023.

* cited by examiner

MAGNETIC SENSOR

CROSS REFERENCE TO RELATED APPLICATIONS

This application is the U.S. National Phase under 35 US.C. § 371 of International Application No. PCT/JP2020/029808, filed on Aug. 4, 2020, which claims the benefit of Japanese Application No. 2019-175986, filed on Sep. 26, 2019, the entire contents of each are hereby incorporated by reference.

TECHNICAL FIELD

The present invention relates to a magnetic sensor and, more particularly, to a magnetic sensor for detecting an extremely weak magnetic field.

BACKGROUND ART

As described in Patent Document 1, there is known a magnetic sensor of a type that detects the direction and strength of a magnetic field based on a change in the resistance value of a magnetoresistive element. The magnetic sensor described in Patent Document 1 uses a meander-shaped magnetoresistive element to achieve a sufficient resistance value. Further, a plurality of hard magnetic members (magnets) are arranged so as to separate the magnetoresistive element to apply a magnetic bias to the magnetoresistive element. When being applied with a magnetic bias, the magnetoresistive element is ideally put into a single magnetic domain state, allowing a reduction in random noise that may be superimposed on a detection signal.

CITATION LIST

Patent Document

[Patent Document 1] Japanese Patent No. 5,066,579

SUMMARY OF THE INVENTION

Problem to be Solved by the Invention

However, the magnetic sensor described in Patent Document 1 uses the meander-shaped magnetoresistive element, so that the direction of current flowing in one section of the magnetoresistive element and the direction of current flowing in another section thereof are opposite to each other. On the other hand, the direction of a magnetic bias is the same over all the sections of the magnetoresistive element. It follows that the relation between the direction of the magnetic bias and the direction of flow of current differs in each section, failing to achieve a sufficient reduction in random noise, which makes it difficult to detect an extremely weak magnetic field.

It is therefore an object of the present invention to detect an extremely weak magnetic field by effectively reducing random noise in a magnetic sensor using a magnetoresistive element.

Means for Solving the Problem

A magnetic sensor according to the present invention has a first magnetoresistive strip including a plurality of magnetoresistive elements arranged in a first direction through a plurality of hard magnetic members that apply a magnetic bias, first and second ferromagnetic films arranged in a second direction crossing the first direction through a first magnetic gap extending in the first direction, and first and second terminal electrodes. The first magnetoresistive strip is disposed around the first magnetic gap to be applied with a magnetic field to be detected in the second direction. One end of the first magnetoresistive strip in the first direction is connected to the first terminal electrode not through another magnetoresistive element applied with the magnetic field to be detected, and the other end of the first magnetoresistive strip in the first direction is connected to the second terminal electrode not through another magnetoresistive element applied with the magnetic field to be detected.

According to the present invention, the first magnetoresistive strip has a linear shape not having a folded structure, so that the relation between the direction of a magnetic bias and the direction of flow of current becomes constant over all the sections of the first magnetoresistive strip. This significantly reduces random noise to allow for detection of an extremely weak magnetic field.

In the present invention, the first and second ferromagnetic films may overlap the plurality of magnetoresistive elements and the plurality of hard magnetic members. This allows the magnetic field to be detected to be applied to the plurality of magnetoresistive elements more effectively.

The magnetic sensor may further have a first end hard magnetic member disposed at the one end of the first magnetoresistive strip and a second end hard magnetic member disposed at the other end of the first magnetoresistive strip, and the first and second ferromagnetic films need not necessarily overlap the first and second end hard magnetic members. With this configuration, the magnetic field to be detected collected by the first and second ferromagnetic films is less likely to be taken into the first and second end hard magnetic members. This makes it possible to apply the magnetic field to be detected to the first magnetoresistive strip still more effectively.

In the present invention, the first magnetoresistive strip may include a low resistive film mutually connecting the plurality of magnetoresistive elements, the low resistive film having a resistance value lower than those of the magnetoresistive element and hard magnetic member, and a part of the low resistive film may be disposed between the magnetoresistive element and the hard magnetic member. Thus, even when the resistance value of the hard magnetic member is high, conductivity of the first magnetoresistive strip can be maintained. Further, a resistance barrier between the magnetoresistive element and the hard magnetic member is reduced to make it possible to suppress electric random noise more effectively.

The magnetic sensor according to the present invention may further have a second magnetoresistive strip including a plurality of magnetoresistive elements arranged in the first direction through a plurality of hard magnetic members that apply a magnetic bias, a third ferromagnetic film, and a third terminal electrode. The first and third ferromagnetic films may be arranged in the second direction through a second magnetic gap extending in the first direction, and the second magnetoresistive strip may be disposed around the second magnetic gap to be applied with the magnetic field to be detected in the second direction. One end of the second magnetoresistive strip in the first direction may be connected to the third terminal electrode not through another magnetoresistive element applied with the magnetic field to be detected, and the other end of the second magnetoresistive strip in the first direction may be connected to the first terminal electrode not through another magnetoresistive element applied with the magnetic field to be detected. The direction of currents flowing in the first and second magnetoresistive strips may be the same, and the direction of the magnetic bias applied to the first and second magnetoresistive strips may be the same. With this configuration, a half-bridge circuit is constituted by the first and second magnetoresistive strips, allowing detection sensitivity to be further enhanced.

The magnetic sensor according to the present invention may further have a compensating coil that applies a cancelling magnetic field to the first and second magnetoresistive strips. The compensating coil may include a first section extending in the first direction along the first magnetoresistive strip and a second section extending in the first direction along the second magnetoresistive strip, and the directions of current flowing in the first and second sections may be opposite to each other. With this configuration, closed-loop control can be performed for the first and second magnetoresistive strips.

The magnetic sensor according to the present invention may further have third and fourth magnetoresistive strips each including a plurality of magnetoresistive elements arranged in the first direction through a plurality of hard magnetic members that apply a magnetic bias and a fourth terminal electrode. The first and second ferromagnetic films may further form a third magnetic gap extending in the first direction, and the first and third ferromagnetic films may further form a fourth magnetic gap extending in the first direction. The third magnetoresistive strip may be disposed around the third magnetic gap to be applied in the second direction with the magnetic field to be detected, and the fourth magnetoresistive strip may be disposed around the fourth magnetic gap to be applied in the second direction with the magnetic field to be detected. One end of the third magnetoresistive strip in the first direction may be connected to the third terminal electrode not through another magnetoresistive element applied with the magnetic field to be detected, and the other end of the third magnetoresistive strip in the first direction may be connected to the fourth terminal electrode not through another magnetoresistive element applied with the magnetic field to be detected. One end of the fourth magnetoresistive strip in the first direction may be connected to the second terminal electrode not through another magnetoresistive element applied with the magnetic field to be detected, and the other end of the fourth magnetoresistive strip in the first direction may be connected to the fourth terminal electrode not through another magnetoresistive element applied with the magnetic field to be detected. The direction of current flowing in the first to fourth magnetoresistive strips may be the same, and the direction of the magnetic bias applied to the first to fourth magnetoresistive strips may be the same. With this configuration, a full-bridge circuit is constituted by the first to fourth magnetoresistive strips, allowing detection sensitivity to be still more enhanced.

The magnetic sensor according to the present invention may further have a compensating coil that applies a cancelling magnetic field to the first to fourth magnetoresistive strips. The compensating coil may include a first section extending in the first direction along the first magnetoresistive strip, a second section extending in the first direction along the second magnetoresistive strip, a third section extending in the first direction along the third magnetoresistive strip, and a fourth section extending in the first direction along the fourth magnetoresistive strip. The direction of current flowing in the first and third sections may be the same, the direction of current flowing in the second and fourth sections may be the same, and the directions of current flowing in the first and second sections may be opposite to each other. With this configuration, closed-loop control can be performed for the first to fourth magnetoresistive strips.

Advantageous Effects of the Invention

As described above, according to the present invention, random noise is significantly reduced to allow for detection of an extremely weak magnetic field.

BRIEF DESCRIPTION OF THE DRAWINGS

FIGS. 3A and 3B are each a schematic view for explaining the structure of the magnetoresistive strip S according to a modification, in which FIG. 3A is an xy plan view, and FIG. 3B is a yz cross-sectional view.

MODE FOR CARRYING OUT THE INVENTION

Hereinafter, preferred embodiments of the present invention will be described in detail with reference to the accompanying drawings.

First Embodiment

Figure 1:
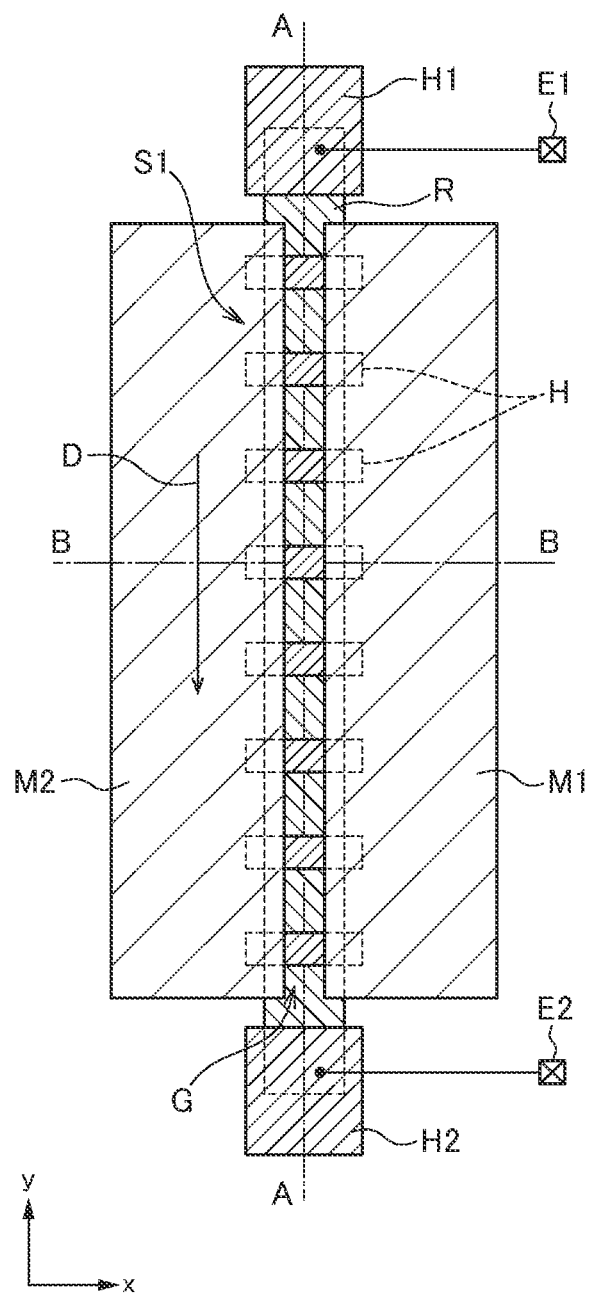
FIG. 1 is a schematic plan view for explaining the structure of a magnetic sensor 1 according to a first embodiment of the present invention.
Figure 2A:
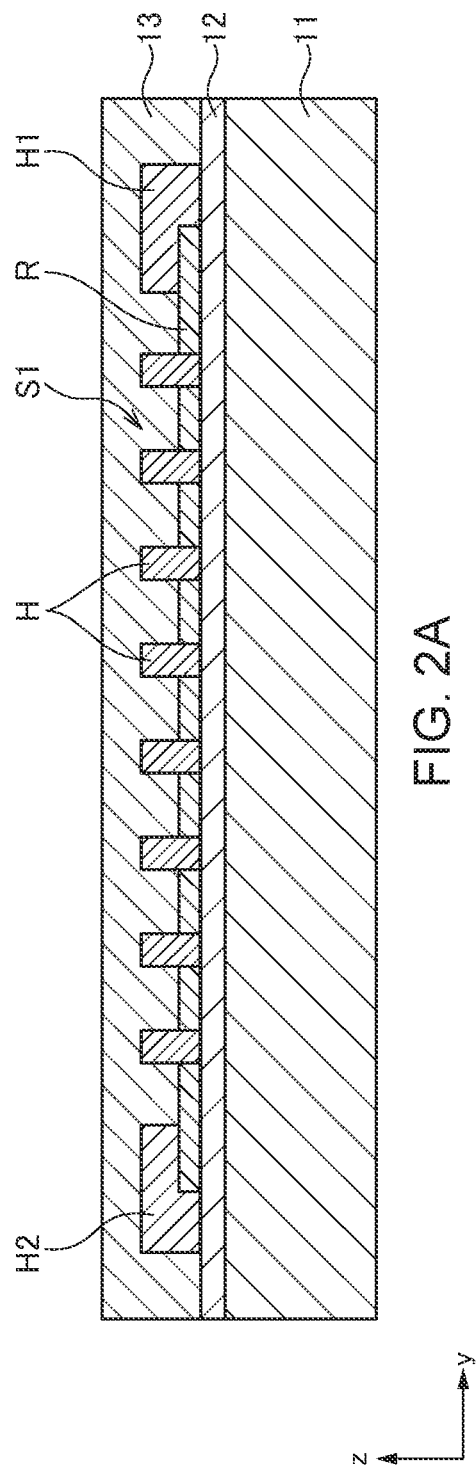
FIG. 2A is a schematic cross-sectional view taken along the line A-A in FIG. 1.
Figure 2B:
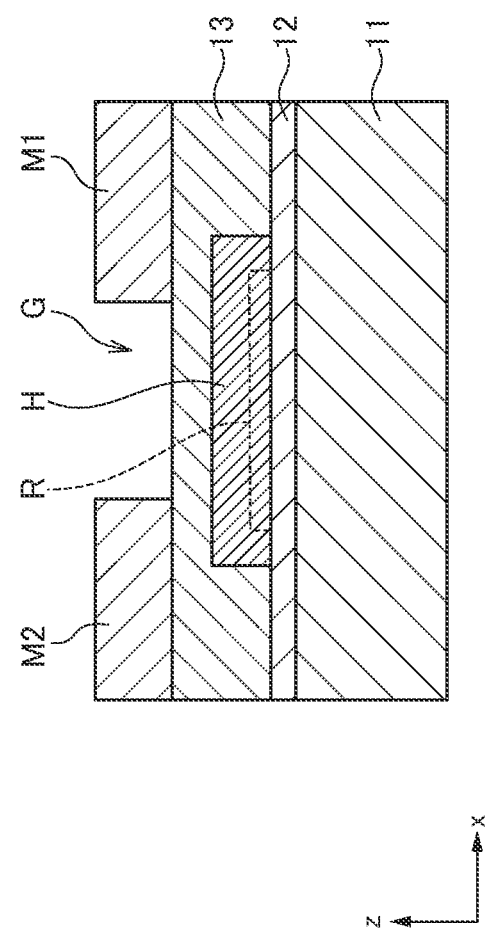
FIG. 2B is a schematic cross-sectional view taken along the line B-B in FIG. 1.

FIG. 1 is a schematic plan view for explaining the structure of a magnetic sensor 1 according to a first embodiment of the present invention. FIG. 2A is a schematic cross-sectional view taken along the line A-A in FIG. 1, and FIG. 2B is a schematic cross-sectional view taken along the line B-B in FIG. 1.

As illustrated in FIGS. 1 and 2, the magnetic sensor according to the present embodiment has a magnetoresistive strip S extending in the y-direction and two ferromagnetic films M1 and M2 arranged in the x-direction. The magnetoresistive strip S is formed on a sensor substrate 11 through an insulating film 12 and includes a plurality of magnetoresistive elements R arranged in the y-direction through a plurality of hard magnetic members (magnets) H. The magnetoresistive element R is not particularly limited in material as long as the resistance value thereof changes depending on the direction and strength of a magnetic field. The magnetoresistive elements R are separated by the plurality of hard magnetic members H in the y-direction and put into a substantially single magnetic domain state by a magnetic bias applied by the hard magnetic members H. This reduces random noise caused due to disturbance of a magnetic domain. To reliably put the magnetoresistive element R into a single magnetic domain state, it is preferable to set the length of the individual magnetoresistive elements R in the y-direction to about several µm.

The magnetoresistive strip S is covered with a protective film 13, and the ferromagnetic films M1 and M2 are formed on the surface of the protective film 13. The ferromagnetic films M1 and M2 are arranged in the x-direction through a magnetic gap G extending in the y-direction. In the present embodiment, the magnetic gap G and the magnetoresistive strip S overlap each other in a plan view as viewed in the z-direction. More specifically, the width of the magnetic gap G in the x-direction is smaller than the width of the magnetoresistive strip S in the x-direction, so that the ferromagnetic films M1 and M2 partly overlap the magnetoresistive elements R and hard magnetic members H as viewed in the z-direction. It follows that the magnetic field to be detected going from the ferromagnetic film M1 to the ferromagnetic film M2 or that going from the ferromagnetic film M2 to the ferromagnetic film M1 is applied in the x-direction to the magnetoresistive strip S. However, in the present embodiment, the magnetic gap G and magnetoresistive strip S need not necessarily overlap each other in the z-direction, and the positional relation therebetween does not matter as long as the magnetoresistive strip S is disposed around the magnetic gap G, i.e., on a magnetic path formed by the magnetic gap G and whereby the magnetic field to be detected is applied in the x-direction to the magnetoresistive strip S.

As illustrated in FIG. 1, one end of the magnetoresistive strip S in the y-direction is connected to a terminal electrode E1, and the other end thereof is connected to a terminal electrode E2. More specifically, the one end of the magnetoresistive strip S in the y-direction is connected to the terminal electrode E1 not through another magnetoresistive element applied with the magnetic field to be detected, and similarly, the other end of the magnetoresistive strip S in the y-direction is connected to the terminal electrode E2 not through another magnetoresistive element applied with the magnetic field to be detected. That is, in the present embodiment, the magnetoresistive strip S has a linear shape not having a folded structure. The terminal electrodes E1 and E2 are connected to a not-shown detection circuit, whereby the magnetic field to be detected can be measured based on a resistance value between the terminal electrodes E1 and E2.

As described above, in the magnetic sensor 1 according to the present embodiment, the magnetoresistive strip S has a linear shape not having a folded structure, so that unlike when the magnetoresistive strip S is folded in a meander shape, the relation between the direction D of the magnetic bias and the direction of flow of current becomes constant over the entire area. This significantly reduce random noise to allow for detection of an extremely weak magnetic field.

Further, in the present embodiment, one end and the other end of the magnetoresistive strip S are covered respectively with end hard magnetic members H1 and H2. The end hard magnetic members H1 and H2 have a size larger than that of the other hard magnetic members H. The ferromagnetic films M1 and M2 do not overlap the end hard magnetic members H1 and H2 as viewed in the z-direction, so that the magnetic field to be detected collected by the ferromagnetic films M1 and M2 is less likely to be taken into the end hard magnetic members H1 and H2. This makes it possible to effectively apply the magnetic field to be detected, to the magnetoresistive strip S.

Figure 3A:
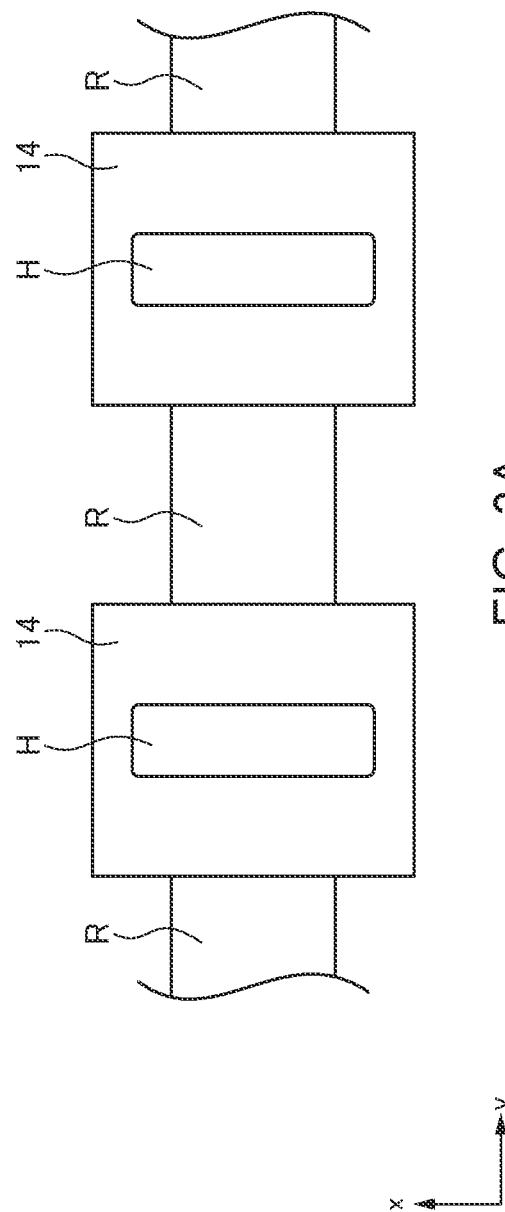
Figure 3B:
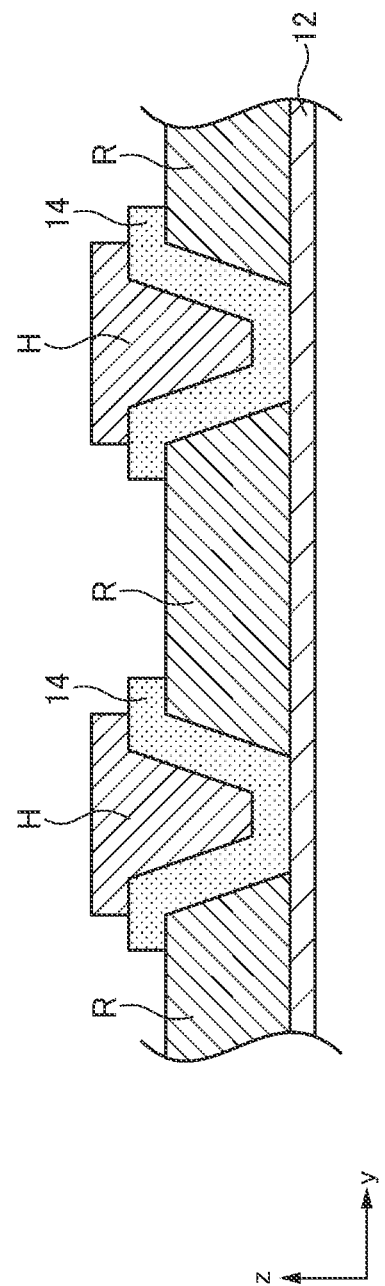

FIGS. 3A and 3B are each a schematic view for explaining the structure of the magnetoresistive strip S according to a modification, in which FIG. 3A is an xy plan view, and FIG. 3B is a yz cross-sectional view.

The magnetoresistive strip S illustrated in FIG. 3 further has a low resistive film 14. The low resistive film 14 is made of a material having a resistance value lower than those of the magnetoresistive element R and hard magnetic member H and mutually connects the magnetoresistive elements R adjacent in the y-direction on the surface of the insulating film 12 to reduce the resistance of the magnetoresistive strip S. Thus, even when the resistance value of the hard magnetic member H is high, conductivity of the magnetoresistive strip S can be maintained. The low resistive film 14 is a thin film that covers the surface of the insulating film 12 and the side and upper surfaces of the magnetoresistive element R. The hard magnetic member H is embedded in the upper surface of the low resistive film 14. Thus, a part of the low resistive film 14 is interposed between the magnetoresistive element R and the hard magnetic member H, so that a resistance barrier between the magnetoresistive element R and the hard magnetic member H is reduced to make it possible to suppress electric random noise more effectively.

Second Embodiment

Figure 4:
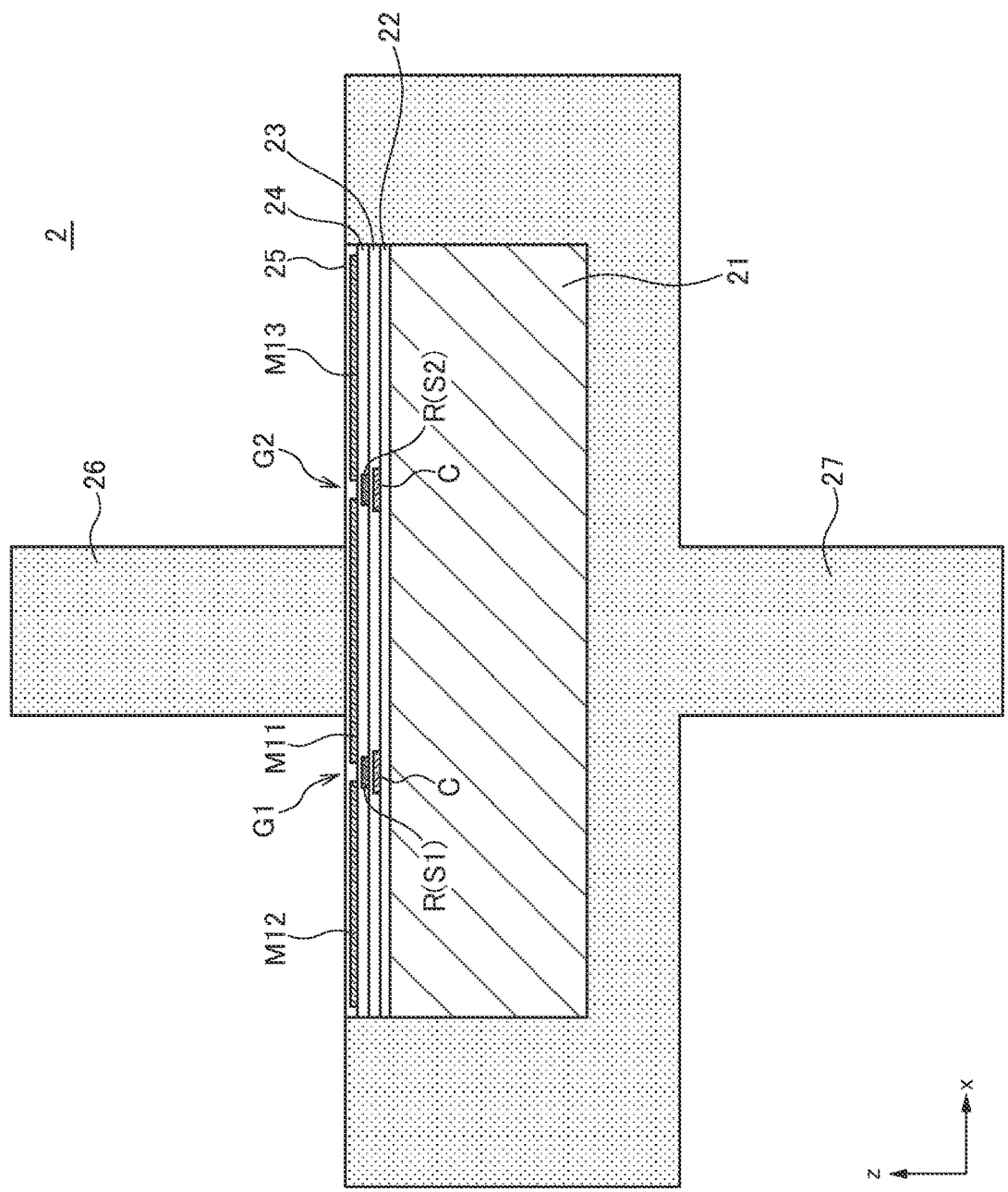
FIG. 4 is a schematic cross-sectional view for explaining the structure of a magnetic sensor 2 according to a second embodiment of the present invention.
Figure 5:
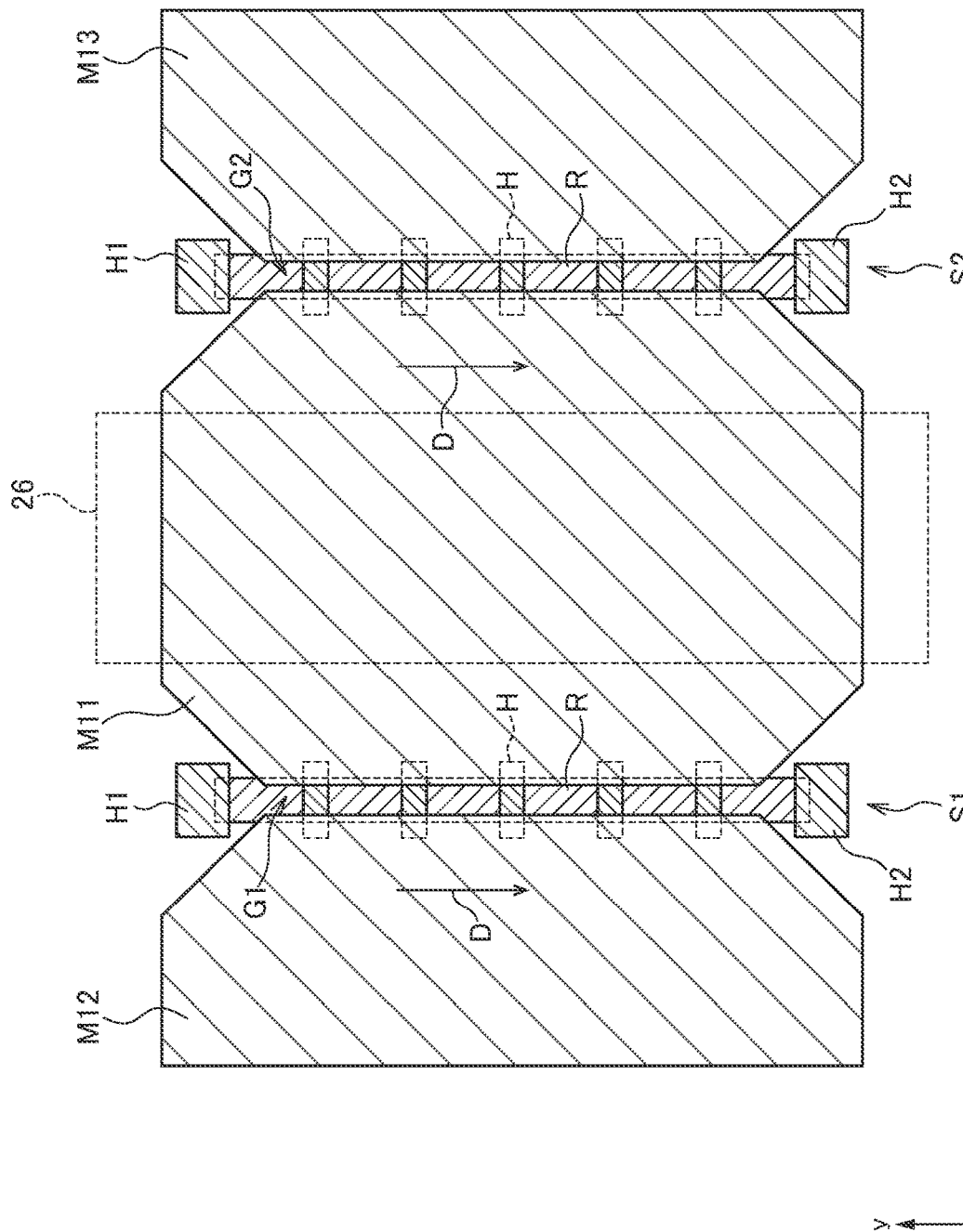
FIG. 5 is a schematic plan view for explaining the structure of the magnetic sensor 2 according to the second embodiment of the present invention.

FIGS. 4 and 5 are schematic cross-sectional and plan views, respectively, for explaining the structure of a magnetic sensor 2 according to a second embodiment of the present invention.

As illustrated in FIGS. 4 and 5, the magnetic sensor 2 according to the second embodiment has insulating films 22 to 25 laminated in this order on a sensor substrate 21, a compensating coil C provided on the surface of the insulating film 22, two magnetoresistive strips S1 and S2 provided on the surface of the insulating film 23, and three ferromagnetic films M11 to M13 provided on the surface of the insulating film 24.

The magnetoresistive strips S1 and S2 each include a plurality of magnetoresistive elements R arranged in the y-direction through a plurality of hard magnetic members H. The direction D of a magnetic bias applied by each hard magnetic member H is the same in the magnetoresistive strips S1 and S2. The ferromagnetic films M11 and M12 are arranged in the x-direction through a magnetic gap G1 extending in the y-direction, and the ferromagnetic films M11 and M13 are arranged in the x-direction through a magnetic gap G2 extending in the y-direction. The magnetoresistive strip S1 is disposed so as to overlap the magnetic gap G1, and the magnetoresistive strip S2 is disposed so as to overlap the magnetic gap G2.

The magnetic sensor 2 according to the present embodiment further has an external magnetic member 26 provided on the upper surface side of the sensor substrate 21 and an external magnetic member 27 that covers the back and side surfaces of the sensor substrate 21. The external magnetic members 26 and 27 are each made of a soft magnetic material such as ferrite and efficiently collect the magnetic field to be detected in the z-direction. The external magnetic member 26 is provided so as to cover the ferromagnetic film M11 through the insulating film 25, whereby the z-direction magnetic field to be detected collected by the external magnetic member 26 is taken into the ferromagnetic film M11 and is then distributed to the ferromagnetic films M12 and M13 through the magnetic gaps G1 and G2, respectively. The magnetic field to be detected going from the ferromagnetic film M11 to the ferromagnetic film M12 is applied in the negative x-direction to the magnetoresistive strip S1, and that going from the ferromagnetic film M11 to the ferromagnetic film M13 is applied in the positive x-direction to the magnetoresistive strip S2. That is, the magnetoresistive strips S1 and S2 are applied in mutually opposite directions with the magnetic field to be detected.

Figure 6:
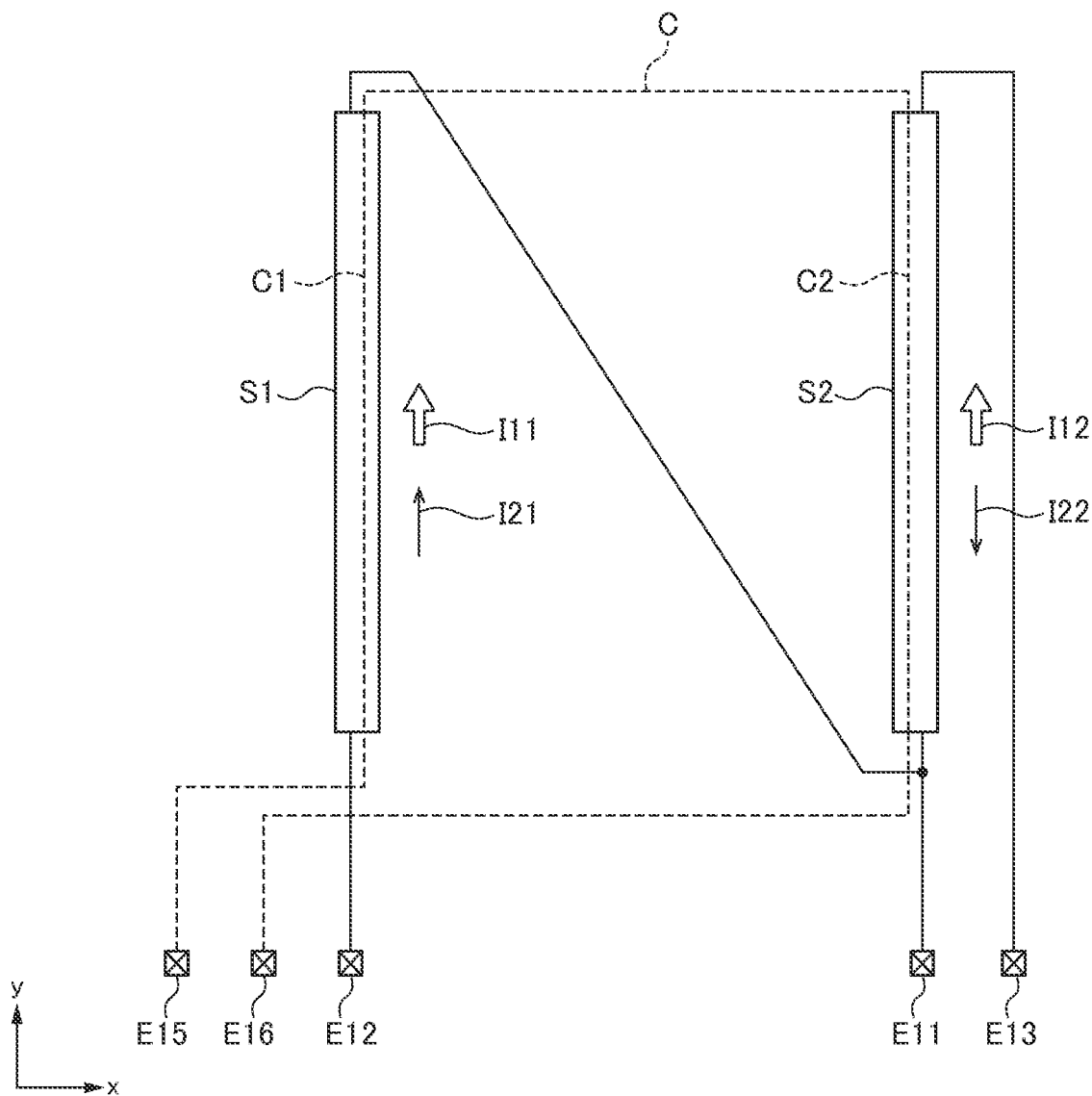
FIG. 6 is a schematic diagram for explaining a connection relation between the magnetoresistive strips S1, S2, and the compensating coil C and the terminal electrodes E11-E13, E15, and E16.

As illustrated in FIG. 6, one end of the magnetoresistive strip S1 in the y-direction is connected to a terminal electrode E11, and the other end thereof is connected to a terminal electrode E12. On the other hand, one end of the magnetoresistive strip S2 in the y-direction is connected to a terminal electrode E13, and the other end thereof is connected to the terminal electrode E11. As a result, the magnetoresistive strips S1 and S2 constitute a half-bridge circuit. In the present embodiment as well, connection between the terminal electrode (E11 to E13) and the magnetoresistive strip (S1 and S2) is made not through another magnetoresistive element applied with the magnetic field to be detected. Thus, when current is made to flow from the terminal electrode E12 toward the terminal electrode E13, current flows in the magnetoresistive strip S1 in the direction denoted by the arrow I11, and current flows in the magnetoresistive strip S2 in the direction denoted by the arrow I12. That is, current flows in the magnetoresistive strips S1 and S2 in the same direction. Since the magnetoresistive strips S1 and S2 are applied with the magnetic field to be detected in mutually opposite directions, it is possible to measure the direction and strength of the magnetic field to be detected by monitoring the potential of the terminal electrode E11 using a not-shown detection circuit.

Further, as illustrated in FIG. 6, one end of the compensating coil C is connected to the terminal electrode E15, and the other end thereof is connected to the terminal electrode E16. The compensating coil C is provided for applying a cancelling magnetic field to the magnetoresistive strips S1 and S2, whereby so-called closed-loop control can be performed. The compensating coil C includes a section C1 extending in the y-direction along the magnetoresistive strip S1 and a section C2 extending in the y-direction along the magnetoresistive strip S2. When current is made to flow from the terminal electrode E15 toward the terminal electrode E16, current flows in the section C1 in the direction denoted by the arrow I21, and current flows in the section C2 in the direction denoted by the arrow I22. That is, current flows in the sections C1 and C2 in mutually opposite directions. This allows for cancellation of the magnetic field to be detected applied to the magnetoresistive strips S1 and S2 in mutually opposite directions by means of the compensating coil C.

As described above, the two magnetoresistive strips S1 and S2 of the magnetic sensor 2 according to the present embodiment do not have a folded structure and are connected such that current flows therein in the same direction. As a result, the relation between the direction of the magnetic bias and the direction of flow of current becomes constant over all the sections of each of the magnetoresistive strips S1 and S2. This significantly reduces random noise to allow for detection of an extremely weak magnetic field.

Third Embodiment

Figure 7:
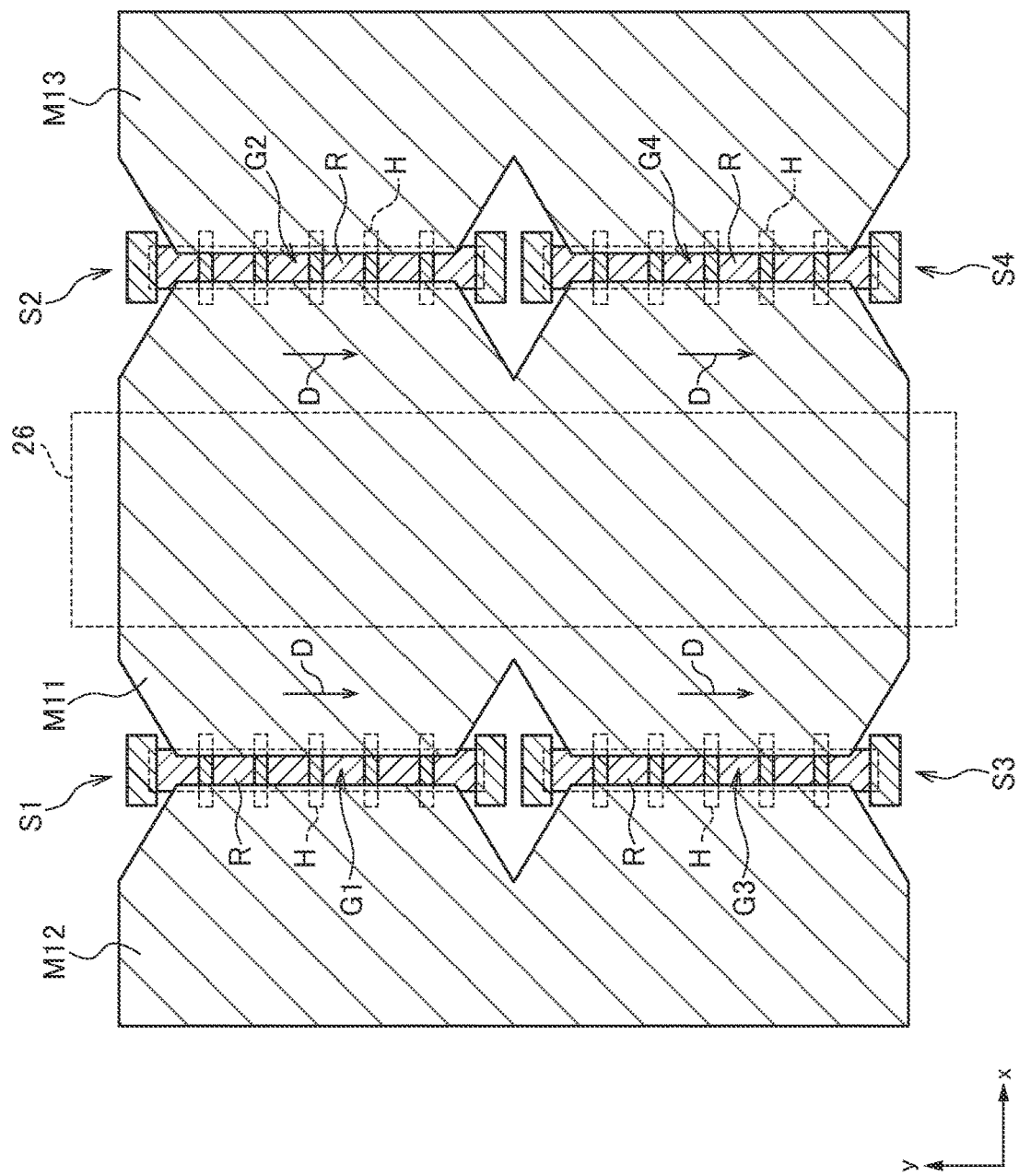
FIG. 7 is a schematic plan view for explaining the structure of a magnetic sensor 3 according to a third embodiment of the present invention.

FIG. 7 is a schematic plan view for explaining the structure of a magnetic sensor 3 according to a third embodiment of the present invention.

As illustrated in FIG. 7, the magnetic sensor 3 according to the third embodiment differs from the magnetic sensor 2 according to the second embodiment in the following points: a magnetic gap G3 extending in the y-direction is formed between the ferromagnetic films M11 and M12; a magnetic gap G4 extending in the y-direction is formed between the ferromagnetic films M11 and M13; a magnetoresistive strip S3 is disposed so as to overlap the magnetic gap G3; and a magnetoresistive strip S4 is disposed so as to overlap the magnetic gap G4. The magnetoresistive strips S3 and S4 each include a plurality of magnetoresistive elements R arranged in the y-direction through a plurality of hard magnetic members H. The direction D of a magnetic bias applied by each hard magnetic member H is the same in the magnetoresistive strips S1 to S4.

With this configuration, the magnetic field to be detected taken into the ferromagnetic film M11 through the external magnetic member 26 is distributed to the ferromagnetic films M12 and M13 through the magnetic gaps G1 to G4. The magnetic field to be detected going from the ferromagnetic film M11 to the ferromagnetic film M12 is applied in the negative x-direction to the magnetoresistive strips S1 and S3, and that going from the ferromagnetic film M11 to the ferromagnetic film M13 is applied in the positive x-direction to the magnetoresistive strips S2 and S4. That is, the application direction of the magnetic field to be detected to the magnetoresistive strips S1 and S3 and the application direction of the magnetic field to be detected to the magnetoresistive strips S2 and S4 are opposed to each other.

Figure 8:
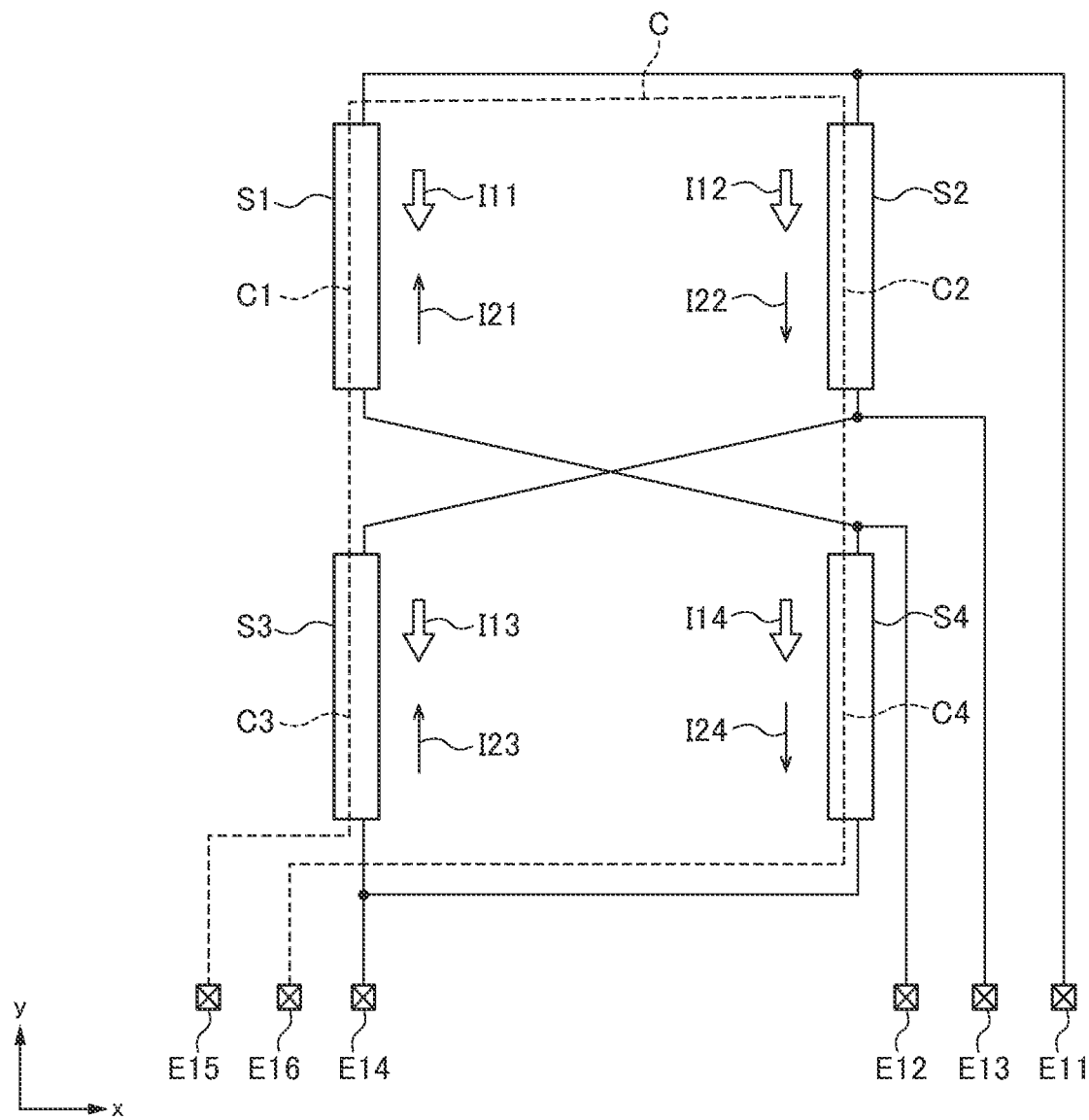
FIG. 8 is a schematic diagram for explaining a connection relation between the magnetoresistive strips S1-S4 and the compensating coil C and the terminal electrodes E11-E16.

The magnetoresistive strips S1 to S4 are connected as illustrated in FIG. 8: one end of the magnetoresistive strip S1 in the y-direction is connected to the terminal electrode E11, and the other end thereof is connected to the terminal electrode E12; one end of the magnetoresistive strip S2 in the y-direction is connected to the terminal electrode E13, and the other end thereof is connected to the terminal electrode E11; one end of the magnetoresistive strip S3 in the y-direction is connected to the terminal electrode E13, and the other end thereof is connected to the terminal electrode E14; and one end of the magnetoresistive strip S4 in the y-direction is connected to the terminal electrode E12, and the other end thereof is connected to the terminal electrode E14. As a result, the magnetoresistive strips S1 to S4 constitute a full-bridge circuit. In the present embodiment as well, connection between the terminal electrode (E11 to E14) and the magnetoresistive strip (S1 to S4) is made not through another magnetoresistive element applied with the magnetic field to be detected. Thus, when current is made to flow from the terminal electrode E11 toward the terminal electrode E14, current flows in the magnetoresistive strips S1 to S4 in the directions denoted by the arrows I11 to I14, respectively. That is, current flows in the magnetoresistive strip S1 to S4 in the same direction. Since the application direction of the magnetic field to be detected to the magnetoresistive strips S1 and S3 and application direction of the magnetic field to be detected to the magnetoresistive strips S2 and S4 are opposed to each other, it is possible to measure the direction and strength of the magnetic field to be detected by monitoring the voltage between the terminal electrodes E12 and E13 using a not-shown detection circuit.

Further, as illustrated in FIG. 8, one end of the compensating coil C is connected to the terminal electrode E15, and the other end thereof is connected to the terminal electrode E16. The compensating coil C is provided for applying a cancelling magnetic field to the magnetoresistive strips S1 to S4, whereby so-called closed-loop control can be performed.

The compensating coil C includes a section C1 extending in the y-direction along the magnetoresistive strip S1, a section C2 extending in the y-direction along the magnetoresistive strip S2, a section C3 extending in the y-direction along the magnetoresistive strip S3, and a section C4 extending in the y-direction along the magnetoresistive strip S4. When current is made to flow from the terminal electrode E15 toward the terminal electrode E16, current flows in the sections C1 to C4 in the directions denoted by the arrows I21 to I24, respectively. That is, the direction of current flowing in the sections C1 and C3 and the direction of current flowing in the sections C2 and C4 are opposite to each other. This allows for cancellation of the magnetic fields to be detected applied in mutually opposite directions to the magnetoresistive strips S1, S3 and the magnetoresistive strips S2, S4 by means of the compensating coil C.

As described above, in the magnetic sensor 3 according to the present embodiment, the four magnetoresistive strips S1 to S4 do not have a folded structure and are connected such that current flows therein in the same direction. As a result, the relation between the direction of the magnetic bias and the direction of flow of current becomes constant over all the sections of each of the magnetoresistive strips S1 to S4. This significantly reduces random noise to allow for detection of an extremely weak magnetic field.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST 1-3 magnetic sensor
11 sensor substrate
12 insulating film
13 protective film
14 low resistive film
21 sensor substrate
22-25 insulating film
26,27 external magnetic member
C compensating coil
C1-C4 section
D direction of magnetic bias
E1, E2, E11-E16 terminal electrode
G, G1-G4 magnetic gap
H hard magnetic member
H1, H2 end hard magnetic member
M1, M2, M11-M13 ferromagnetic film
R magnetoresistive element
S, S1-S4 magnetoresistive strip

What is claimed is:
1. A magnetic sensor comprising:
a first magnetoresistive strip including a plurality of magnetoresistive elements arranged in a first direction through a plurality of hard magnetic members that apply a magnetic bias;
first and second ferromagnetic films arranged in a second direction crossing the first direction through a first magnetic gap extending in the first direction; and
first and second terminal electrodes,
wherein the first magnetoresistive strip is disposed around the first magnetic gap to be applied with a magnetic field to be detected in the second direction,
wherein one end of the first magnetoresistive strip in the first direction is connected to the first terminal electrode not through another magnetoresistive element applied with the magnetic field to be detected, and
wherein other end of the first magnetoresistive strip in the first direction is connected to the second terminal electrode not through another magnetoresistive element applied with the magnetic field to be detected.

2. The magnetic sensor as claimed in claim 1, wherein the first and second ferromagnetic films overlap the plurality of magnetoresistive elements and the plurality of hard magnetic members.

3. The magnetic sensor as claimed in claim 2, further comprising:
a first end hard magnetic member disposed at the one end of the first magnetoresistive strip; and
a second end hard magnetic member disposed at the other end of the first magnetoresistive strip,
wherein the first and second ferromagnetic films do not overlap the first and second end hard magnetic members.

4. The magnetic sensor as claimed in claim 1,
wherein the first magnetoresistive strip includes a low resistive film mutually connecting the plurality of magnetoresistive elements, the low resistive film having a resistance value lower than those of the magnetoresistive element and the hard magnetic member, and
wherein a part of the low resistive film is disposed between the magnetoresistive element and the hard magnetic member.

5. The magnetic sensor as claimed in claim 1, further comprising:
a second magnetoresistive strip including a plurality of magnetoresistive elements arranged in the first direction through a plurality of hard magnetic members that apply a magnetic bias;
a third ferromagnetic film; and
a third terminal electrode,
wherein the first and third ferromagnetic films are arranged in the second direction through a second magnetic gap extending in the first direction,
wherein the second magnetoresistive strip is disposed around the second magnetic gap to be applied with the magnetic field to be detected in the second direction,
wherein one end of the second magnetoresistive strip in the first direction is connected to the third terminal electrode not through another magnetoresistive element applied with the magnetic field to be detected,
wherein other end of the second magnetoresistive strip in the first direction is connected to the first terminal electrode not through another magnetoresistive element applied with the magnetic field to be detected,
wherein a direction of currents flowing in the first and second magnetoresistive strips is the same, and
wherein a direction of the magnetic bias applied to the first and second magnetoresistive strips is the same.

6. The magnetic sensor as claimed in claim 5, further comprising a compensating coil that applies a cancelling magnetic field to the first and second magnetoresistive strips,
wherein the compensating coil includes a first section extending in the first direction along the first magnetoresistive strip and a second section extending in the first direction along the second magnetoresistive strip, and
wherein directions of current flowing in the first and second sections are opposite to each other.

7. The magnetic sensor as claimed in claim 5, further comprising:

third and fourth magnetoresistive strips each including a plurality of magnetoresistive elements arranged in the first direction through a plurality of hard magnetic members that apply a magnetic bias; and a fourth terminal electrode, wherein the first and second ferromagnetic films further form a third magnetic gap extending in the first direction, wherein the first and third ferromagnetic films further form a fourth magnetic gap extending in the first direction, wherein the third magnetoresistive strip is disposed around the third magnetic gap to be applied in the second direction with the magnetic field to be detected, wherein the fourth magnetoresistive strip is disposed around the fourth magnetic gap to be applied in the second direction with the magnetic field to be detected, wherein one end of the third magnetoresistive strip in the first direction is connected to the third terminal electrode not through another magnetoresistive element applied with the magnetic field to be detected, wherein other end of the third magnetoresistive strip in the first direction is connected to the fourth terminal electrode not through another magnetoresistive element applied with the magnetic field to be detected, wherein one end of the fourth magnetoresistive strip in the first direction is connected to the second terminal electrode not through another magnetoresistive element applied with the magnetic field to be detected, wherein other end of the fourth magnetoresistive strip in the first direction is connected to the fourth terminal electrode not through another magnetoresistive element applied with the magnetic field to be detected, wherein a direction of current flowing in the first to fourth magnetoresistive strips is the same, and wherein a direction of the magnetic bias applied to the first to fourth magnetoresistive strips is the same.

8. The magnetic sensor as claimed in claim 7, further comprising a compensating coil that applies a cancelling magnetic field to the first to fourth magnetoresistive strips, wherein the compensating coil includes a first section extending in the first direction along the first magnetoresistive strip, a second section extending in the first direction along the second magnetoresistive strip, a third section extending in the first direction along the third magnetoresistive strip, and a fourth section extending in the first direction along the fourth magnetoresistive strip, wherein a direction of current flowing in the first and third sections is the same, wherein a direction of current flowing in the second and fourth sections is the same, and wherein directions of current flowing in the first and second sections are opposite to each other.

* * * * *